United States Patent [19]

Jasper, Jr.

[11] 4,151,476

[45] Apr. 24, 1979

[54] MAGNETIC BUBBLE TRAVELING WAVE AMPLIFIER

[75] Inventor: Louis J. Jasper, Jr., Ocean, N.J.

[73] Assignee: The United States of America as represented by the Secretary of the Army, Washington, D.C.

[21] Appl. No.: 933,702

[22] Filed: Aug. 15, 1978

[51] Int. Cl.² .............................................. H03F 3/58
[52] U.S. Cl. .......................................... 330/43; 330/5
[58] Field of Search .......................... 330/43, 47, 60, 5; 315/3, 3.5; 331/96

[56] References Cited

U.S. PATENT DOCUMENTS 3,621,411  11/1971  Wisseman ................................. 330/5

Primary Examiner—James B. Mullins
Attorney, Agent, or Firm—Nathan Edelberg; Sheldon Kanars; Daniel D. Sharp

[57] ABSTRACT

A device is disclosed for amplifying electromagnetic waves propagating along a meander line slow wave structure by means of magnetic cylindrical domains or bubbles which are propagating at substantially the same velocity as the RF wave in an adjacent platelet of orthoferrite having associated with it a propagation arrangement of the conventional type which is adapted to move the domains from one end of the platelet to the other. Since the magnetic bubbles are magnetic dipoles that produce magnetic surface charges, a portion of their energy is transferred to the propagating RF wave, resulting in amplification of the RF wave.

11 Claims, 1 Drawing Figure

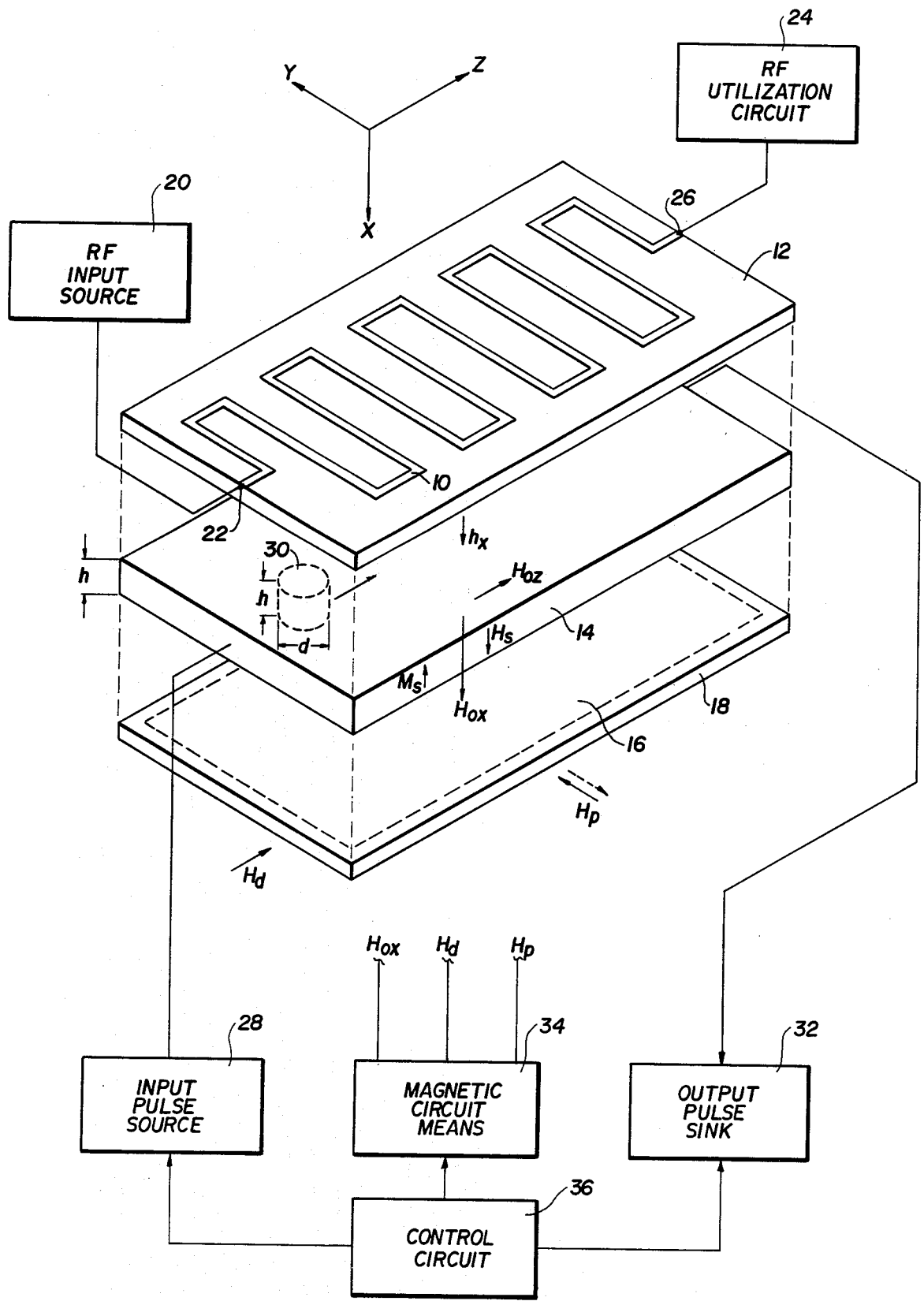

MAGNETIC BUBBLE TRAVELING WAVE AMPLIFIER

The invention described herein may be manufactured and used by or for the Government for governmental purposes without the payment of any royalties thereon or therefor.

BACKGROUND OF THE INVENTION

This invention relates generally to microwave amplification means and more particularly to a traveling wave amplifier using a traveling wave circuit, combined with a magnetic domain propagation circuit.

The principles of traveling wave tubes are well known and set forth in a text book by J. R. Pierce, entitled "Traveling Wave Tubes," D. VanNostrand Company, Inc., New York, New York, 1950. Essentially the traveling wave tube comprises a microwave device in which a longitudinal electron beam interacts continuously with the field of a wave traveling along a wave propagating structure. In its most common form, it is an amplifier in which an electron beam is produced by an electron gun, travels along the axis of the tube and is finally collected by a suitable electrode. Closely spaced around the electron beam is a circuit such as a helix which is capable of propagating a slow wave. The circuit is proportioned so that the phase velocity of the wave is small with respect to the velocity of light. Suitable means are provided to couple an external radio frequency circuit to the slow wave structure at the input and output and the velocity of the electron stream is adjusted to be approximately the same as the phase velocity of the wave traveling on the helix. When a wave is launched on the circuit, the longitudinal component of its field interacts with the electrons traveling along in approximate synchronism with it. Some electrons will be accelerated and some decelerated, resulting in a progressive rearrangement in phase of electrons with respect to the wave. Electron beams thus modulated in turn induces additional waves on the helix. This process of mutual interaction continues along the length of the tube with the net result being that direct current energy is given up by the electron stream to the circuit as radio frequency energy and the wave is thus amplified.

Magnetic domains, commonly referred to as bubbles, generated in thin platelets or orthoferrites, are also well known in the state of the art. The theories that explain the formation and motion of magnetic bubbles are quite complex and numerous references are available on the subject. The orthoferrite medium is normally optically transparent and magnetic bubbles can be seen by using the Faraday rotation of transmitted light. The general shape and dimensions of the bubbles are determined by the magnetostatic and wall energy balance and accordingly magnetic strip and cylindrical domains can be generated under different operating conditions. The movement of the magnetic bubbles from one end of the ferrite plate to the other is effected by a magnetic domain propagation circuit, a typical example being of the type disclosed in U.S. Pat. No. 3,460,116, issued to A. H. Bobeck, et al., Aug. 5, 1969. The magnetic bubbles selectively moved in accordance with its associated propagation circuit is adapted to perform logic, memory and other transmission functions. What is important, however, is that magnetic bubbles constitute moving entities carrying energy and it is postulated that these moving entities under the proper conditions can be made to give up their energy.

Additionally, it is also known in prior art that a slow wave strip line conductor disposed on the surface of a semiconductor sandwiched between insulating layers and covered by a ground plane can be used to control the propagation of potential inversion wells in the surface of the semiconductor when an RF electromagnetic wave is propagated along the strip line conductor. Such a teaching is set forth in U.S. Pat. No. 3,922,716 issued to T. H. DiStefano, Nov. 16, 1976.

SUMMARY

Briefly, the subject invention is directed to a hybrid structure combining traveling wave tube technology with that relating to the formation and transmission of cylindrical magnetic domains or bubbles. The magnetic bubble traveling wave amplifier device according to the subject invention is comprised of a meander line RF strip line slow wave circuit coupled at one end to an RF input source and at the other end to an RF utilization circuit. Immediately adjacent i.e. beneath the meander line circuit is an orthoferrite platelet which is adapted to form and transport magnetic bubbles from one end to the other when an input pulse source and an output pulse sink is coupled thereto. Propagation of the bubbles is controlled by means of an underlying propagation circuit having a predetermined propagation pulse pattern applied thereto from a propagation pulse source. Since the magnetic bubbles are magnetic dipoles that produce magnetic surface charges, propagating across the surface of the orthoferrite platelet, RF energy propagating in the vicinity of and substantially the same velocity as the magnetic surface charges absorb energy from these charges resulting in an amplification of the RF wave traveling on the meander line circuit.

BRIEF DESCRIPTION OF THE DRAWING

The FIGURE is an electrical diagrammatic representation of the preferred embodiment of the subject invention.

DESCRIPTION OF THE PREFERRED EMBODIMENT

It has been determined that magnetic domains or bubbles support waves analogous to space charge waves on an electron beam of a traveling wave tube since they are energy carrying entities in the form of magnetic dipoles that produce magnetic surface charges. Transmission of magnetic bubbles in thin platelets of orthoferrites therefore constitute magnetic surface charges which can be propagated across the orthoferrite platelet and it is postulated that an RF wave propagating in the vicinity of and about the same velocity as the magnetic surface charges can receive energy from these charges under proper operating conditions causing amplification of the RF wave.

Considering now the FIGURE, the preferred embodiment of the subject invention includes three essential elements, one is an RF meander line slow wave circuit 10 consisting of a serpentine pattern of metallization such as copper formed on one side of a thin layer of dielectric material 12. When desirable other types of slow wave configurations may be utilized e.g. an interdigited line. The second essential element is a thin platelet 14 of orthoferrite material ($MFeO_3$) and the third is a magnetic domain propagation circuit 16 of any convenient known type formed on a sheet of dielectric material 18. The meander line circuit 10 propagates a TEM mode wave in the longitudinal direction when an RF input source 20 is coupled to the input end 22 and an RF utilization circuit 24 is coupled to the output end 26. The thickness (h) of the orthoferrite platelet 14 is selectively chosen so that when an input pulse source 28 is coupled thereto in the vicinity of the meander line input 22 a "just right" condition exists for forming magnetic bubbles 30 having a diameter (d) substantially equal to the thickness of the platelet, i.e. d=h when a DC bias magnetic field $H_{ox}$ is applied in a transverse direction through the platelet 14. The $H_{ox}$ field provides a constant gradient in the longitudinal direction so that stable cylindrical bubbles are generated which are adapted to move from the input end to the output end of the platelet to which is connected an output circuit 32. Propagation of the magnetic bubble is provided preferably by a rotating magnetic field acting on the plane of a Permalloy pattern, not shown, in the propagation circuit 16 which magnetic rotating field is provided by two orthogonal components $H_d$ and $H_p$, with $H_d$ being a unidirectional field, while $H_p$ is an alternating bidirectional field. This propagation technique is well known to those skilled in the art and is taught, for example, in U.S. Pat. No. 3,518,643 issued to A. J. Perneski on June 30, 1970. The magnetic circuitry producing a biasing magnetic field $H_{ox}$ as well as the two orthogonal field components $H_d$ and $H_p$ is provided by suitable magnetic circuitry which is well known and generally designated by reference numeral 34. When desirable, other means for propagating the magnetic bubbles can be utilized, such as by applying a sequence of current pulses to a conductor array such as shown, for example, in U.S. Pat. No. 3,460,116 issued to A. H. Bobeck, et al. on Aug. 5, 1969.

The following mathematical treatment describes the theory behind the energy transfer to an RF wave propagating on the meander line 10 from magnetic bubbles 30 propagating in the orthoferrite platelet 14. The analysis set forth below substantially follows the method outlined by J. R. Pierce at pages 9–15 of the aforementioned text entitled "Traveling Wave Tubes," for determining the waves on an elementary electron stream.

For small signals, a wave type solution exists. All AC electronic and circuit quantities vary with time and distance as exp. [$j\omega t - \Gamma Z$] where $\Gamma$ is the propagation constant, $\omega$ is the angular frequency. The meander line circuit 10 as noted above, propagates a TEM mode and the ratio of the RF electric field $e_z$ to the RF magnetic field $h_x$ can be stated as:

$$e_z/h_x = -\sqrt{\mu/\epsilon} \qquad (1)$$

where $\sqrt{\mu/\epsilon}$ is the impedance. The properties of the meander line can be considered as being simulated by a simple delay line or network.

It is assumed that the moving confined magnetic charges associated with the bubbles 30 in the orthoferrite platelet 14 produce the same effect on the RF circuit 10 as an electron stream would produce on an RF circuit in a conventional traveling wave tube. Since the charges do not exist alone, that is they are formed from magnetic dipoles, it is further assumed that the separation between poles is sufficient to avoid complications due to interaction with both poles. The magnetic charges within a cylindrical bubble are assumed to have a uniform distribution and travel very close to the RF circuit 10 so that all displacement current due to the presence of the charges flows directly into the line as an impressed current.

The magnetostatic equation set forth below gives the total force acting on the cylindrical magnetic bubbles 30. The magnetic bubbles are assumed to be cylindrical with uniform surface magnetic charges rather than a strip of uniform magnetic surface charges merely for the sake of convenience. In an actual device, a strip of moving charges might be the preferred embodiment since a larger surface current density would be generated.

The effect the RF circuit 10 produces on the moving magnetic charges associated with the bubbles 30 is different than the effect produced on electron stream by the conventional traveling wave tube since the dipole motion is described differently and has a different voltage-velocity relationship. It is considered that there is an interaction between an electric circuit capable of propagating a slow electromagnetic wave and a stream of magnetic surface charges. The signal current in the circuit is a result of the magnetic surface charges acting on the circuit. The disturbance on the magnetic surface charges is the result of the RF field of the circuit acting on the magnetic surface charges.

The analysis then will be considered in two parts. The first part concerns the disturbance produced on the RF circuit by the stream of magnetic surface charges. As was previously mentioned, this is assumed to produce the same effect on the RF circuit as does an electron stream. The solution accordingly is the same as that given by J. R. Pierce in the aforementioned text. The voltage V in the RF line is then mathematically stated as:

$$v = \frac{-\Gamma\Gamma_1 Ki}{[\Gamma^2 - \Gamma_1^2]} \qquad (2)$$

where $\Gamma=$ the propagation constant, $\Gamma_1$ is the natural propagation constant of the line, K is the interaction impedance and i is the convection current produced by the stream of magnetic surface charges. Since it can be assumed that all quantities vary with distance as exp. [$-\Gamma Z$] differentiation with respect to Z can be replaced by multiplication by $-\Gamma$.

The second part of the analysis is to find the disturbance produced on the stream of magnetic surface charges by the RF fields of the line. It has been stated by A. H. Bobeck in an article entitled "Properties and Device Applications of Magnetic Domains and Orthoferrites," Bell System Technical Journal, Vol. XLVI 8, October, 1957, at pages 1901–1925 that the magnetostatic energy equation which gives the total energy of the magnetic bubble can be expressed as:

$$\xi_{Total} = \xi_w + \xi_D + \xi_{Ha} \qquad (3)$$

where $\xi_w$ is the wall energy, $\xi_D$ is the magnetostatic energy and $\xi_{Ha}$ is the energy of the applied DC field. The above expression can further be defined as:

$$\xi_{Total} = 2\pi rh\sigma_w - \xi_D + 2M_s H_a \pi r^2 h \qquad (4)$$

where $\sigma_w$ is the domain wall energy, $M_s$ is the saturation magnetization, r is the radius of the bubble, h is the thickness of the orthoferrite platelet 14, and $H_a$ is the applied DC field ($H_a = H_{ox} + H_{oz}$), where $H_{ox}$ is the DC biasing field, and $H_{oz}$ is a fictitious DC field corresponding to $h_x$ to be described below.

E. Schlömann in an article entitled "Domain-Wall Motion Induced By Strong Microwave Fields," which appear in Journal Reprints of Raytheon Company, Vol. 12, No. 3, 4, September, December, 1975, at pages 35-38 demonstrated that a DC magnetic field $H_{oz}$ in the Z direction (see figure) is equivalent to an RF field $h_x$ in the X direction with the relationship:

$$H_{oz} = -h_x^2 \left(\frac{\gamma}{\omega}\right) \tag{5}$$

where $\ominus = 1.76 \times 10^{11}$ (rad m/amp sec.) which is the gyromagnetic ratio and $\omega = 2\pi f$ where f is the RF frequency. The total force on the wall of the magnetic bubble 30 is found by differentiation with respect to r, i.e. $\partial/\partial r$. Assuming that $\partial \sigma_w/\partial r$ is negligible, then the total force $\xi_T$ on the wall is:

$$\frac{\delta \xi_T}{\delta r} = 2\pi h \sigma_\omega - \frac{\delta \xi_D}{\delta r} + 4\pi r h M_s H_{ox} + 4\pi r h M_s H_{oz} \tag{6}$$

Equation (6) can be further expressed in terms of fields by dividing by $4\pi M_s rh$, i.e.:

$$\frac{\delta \xi_T/\delta r}{4\pi M_s rh} = H_W - H_D + H_{ox} + H_{oz} \tag{7}$$

where $H_W$ is the wall field, $H_D$ is the demagnetization field, $H_{ox}$ is the DC bias field, and $H_{oz}$ is the aforementioned fictitious field.

The stability condition for a "just right" platelet can be expressed as:

$$H_W = H_D - H_{ox} \tag{8}$$

and accordingly equation (7) reduces to:

$$\frac{\delta \xi_T/\delta r}{4\pi M_s rh} = + H_{oz} \text{ or } \delta \xi_T/\delta r = + 4\pi M_s rh H_{oz} \tag{9}$$

The force per unit area or pressure P on the magnetic bubble 30 is $$P = 2 M_s H_{oz} \tag{10}$$

By letting $$\frac{\delta \xi_T}{\delta r} = M_b \frac{dV}{dt} \tag{11}$$

where $M_b$ is the mass of the magnetic bubble and V is the velocity of the bubble, $$\frac{dV}{dt} = \frac{\delta V}{\delta t} + \frac{\delta V}{\delta Z}\left(\frac{dZ}{dt}\right) \tag{12}$$

Where $V = U_o + W$ where $U_o$ is the average dc velocity, W is the a-c velocity and $W << U_o$. Equation (12) can be rewritten $$\frac{dV}{dt} (j\omega - U \cdot \Gamma) V \tag{13}$$

and the total force on the magnetic bubble as expressed in equation (11) can be expressed in terms of the velocity as:

$$V = \frac{4\pi M_s rh H_{oz}}{U_o M_b (j\beta e - \Gamma)} \tag{14}$$

where $\beta e = \omega/U_o$

The fictitious $H_{oz}$ field is now replaced by the RF field $(h_x)$ as given in equation (5) and accordingly $$V = \frac{-4\pi M_s rh h_x^2 \left(\frac{\gamma}{\omega}\right)}{U_o M_b (j\beta e - \Gamma)} \tag{15}$$

Equation (15) is a macroscopic equation that defines the velocity. To go from the macroscopic realm to the microscopic realm, one introduces the magnetic moment where $M_s = \mu_d N$ where $\mu_d$ is the magnetic moment per unit volume and N is the total number of dipoles in the volume (bubble).

Further assume that a uniform distribution of magnetic charges exists on the surface areas of the bubble which is in the form of a cylinder and that interaction takes place only with charges on the top area of the cylindrical bubble. Let $M_b = 2N$ times the mass of a unit charge. Therefore $M_b = 2NM_q$ where $M_q$ = mass of a unit charge.

Equation (15) now becomes:

$$V = \frac{-\pi \mu_d h^2 h_x^2 \left(\frac{\Gamma}{\omega}\right)}{U_o M_q (j\beta e - \Gamma)} \tag{16}$$

Let $M_d = \mu_d \pi h^3/4$ where $M_d$ = magnetic dipole moment. Equation (16) becomes $$V = \frac{-8 \frac{M_d}{h} h_x^2 \left(\frac{\gamma}{\omega}\right)}{2 U_o M_q (j\beta e - \Gamma)} \tag{18}$$

The magnetic dipole moment can be expressed in terms of the angular momentum which holds for orbital motion even on the atomic scale.

That is $$M_d = \gamma L \text{ or } \gamma M_q(h^2/4) \omega_o \tag{19}$$

where $\gamma$ is the gyromagnetic ratio, L is the angular momentum, $h/2$ is the radius of spin where $h = 2r$ and $\omega_o = 2\pi$ times the precession frequency.

A condition is imposed on the RF magnetic field. This allows the root equation for the propagation constant to be of the 4th degree in $\Gamma$, so that any disturbance of the circuit and the magnetic charge stream can be expressed as the sum of four waves. Using this condition and the relationship given by equation (1) gives $$h_x = \frac{\omega}{\gamma} = \frac{-\Gamma v}{\sqrt{\frac{\mu}{\epsilon}}} \tag{20}$$

Equation (20) gives the RF magnetic field strength as a function of frequency and also as related to the RF electric field strength. Substituting equations (19) and (20) into equation (18) gives $$V = \frac{2\gamma\omega_o h \Gamma v}{2\sqrt{\frac{\mu}{\epsilon}} U_o(j\beta e - \Gamma)} \quad (21)$$

The continuity equation or conservation of charge equation is now used as derived by J. R. Pierce, $$i = \frac{j\beta e\rho_o V}{(j\beta e - \Gamma)} \quad (22)$$

where $\rho_o = I_o/U_o$ is the average charge per unit length and $I_o$ = average convection current.

Using equation (21), the a-c component of the convection current i is:

$$i = \frac{2j\beta e\gamma\omega_o h \Gamma I_o v}{2\sqrt{\frac{\mu}{\epsilon}} U_o^2 (j\beta e - \Gamma)^2} \quad (23)$$

The derivation of the average dc velocity, $U_o$, is $$|U_o| = (\tfrac{1}{2}\mu_w |\Delta H_{ox}| - (8/\pi)H_c) \quad (24)$$

or $$|U_o| = \tfrac{1}{2}\mu_w |\Delta H_{ox}|$$

for $\Delta H_{ox} > 8/\pi\, H_c$ where $\mu_w$ is the wall mobility and $H_c$ is the coercivity of the orthoferrite platelet.

$$H_{ox} = (\partial H_{ox} d/\partial Z)$$

and d=h (diameter of the magnetic bubble), therefore, equation (24) becomes:

$$U_o = \frac{\mu_w}{2} h \left(\frac{\delta H_{ox}}{\delta Z}\right) \quad (25)$$

where $\mu_w/2 = \mu_b$ and $\mu_b$ = bubble (domain) mobility.

The wall mobility can be expressed as:

$$\mu_w = \frac{\gamma L_w}{a\pi} \quad (26)$$

where a is the Gilbert damping constant, and $L_w$ is the generalized wall width but $$L_w = \frac{4\pi A}{\sigma_w} \text{ or } L_w = \pi\sqrt{\frac{A}{K_\mu}} \quad (27)$$

where A is the isotropic exchange constant and $K_\mu$ is the uniaxial anisotropy constant.

It can be shown that the ratio of preferred domain diameter to the domain wall width is $$\frac{h}{L_w} = \frac{16}{\pi} q \text{ or } L_w = \frac{h\pi}{16q} \quad (28)$$

where $q = (K_\mu/2\pi M_s^2)$

Equation (26) becomes $$\mu_w = (\gamma h/16\, qa) \quad (29)$$

and equation (25) becomes $$U_o = \left(\frac{\gamma h^2}{32\, qa}\right) \frac{\delta H_{ox}}{\delta Z} \quad (30)$$

It can further be shown that one can consider the isotropic exchange constant A, to be fixed and then choose preferred values for the domain diameter and ratio q. In the drawing domain diameter d=h. If q were less than one, then the domain wall width would be larger than the domain diameter and in essence no domain would exist. Therefore, q is greater than one. Also, for very large values of q the velocity of the domains would be small, since q is inversely proportional to $U_o$. Since large velocities are desirable for this type application, a preferred value of q=3.

When the dc magnetic field ($H_{ox}$) has a uniform gradient in the Z direction, it can be expressed as a linear equation with distance, i.e.

$$H_{ox} = QZ + b \quad (31)$$

where Q and b are constants and $Q = \partial H_{ox}/\partial Z$

By setting q=3 then equation (30) becomes $$U_o = \frac{\gamma h^2 Q}{96 a} \quad (32)$$

The convection current, i, can now be expressed in terms of equation (32) as follows:

$$i = \frac{j\beta_e I_o \Gamma v}{2(j\beta_e - \Gamma)^2} \left[\frac{1.8 \times 10^4 \omega_o a^2}{\sqrt{\frac{\mu}{\epsilon}}\, \gamma h^3 Q^2}\right] \quad (33)$$

The above term in brackets has units of volt$^{-1}$, therefore equation (33) can be written in terms of an effective voltage.

$$v_o = \frac{\sqrt{\frac{\mu}{\epsilon}}\, h^3 \gamma Q^2}{1.8 \times 10^4\, \omega_o a^2} = \frac{U_o^2 \sqrt{\frac{\mu}{\epsilon}}}{2h\, \gamma\omega_o} \quad (34)$$

where $V_o$ is an effective voltage. Therefore $$i = \frac{j\beta_e I_o \Gamma v}{2v_o(j\beta_e - \Gamma)^2} \quad (35)$$

Equation (35) is identical to the equation derived by J. R. Pierce. However, the voltage-velocity relationship for Pierce's equation is $U_o = \sqrt{2\eta}V_o$ and the voltage-velocity relationship as given in equation (34) is $$U_o = \left(\sqrt{\frac{h\omega_o}{(\mu/\epsilon)}}\, 1/2\right) \sqrt{2\gamma v_o} \quad (36)$$

Note that $\gamma$ and $\eta$ have the same numerical value but different units. One can now follow Pierce's method of solution. Equation (2) gives the convection current in terms of voltage and equation (35) gives the voltage in terms of convection current. Any value of, $\Gamma$, that satisfies both of these equations gives the mode of propagation. Assume, that the speed of the magnetic charge is equal to the speed of the wave in the absence of charges and assume that the propagation constant $\Gamma$ differs from $\beta e$ by a small amount, $\xi$, so that $-\Gamma_1 = -j\beta e$ and $-\Gamma = -j\beta e + \xi$. Since $\beta e >> \xi$ the terms of $\beta e\xi$ and $\xi^2$ can be dropped when appropriate. Combining equations (2) and (35) gives $$i = \frac{jKI_o\beta e\Gamma^2\Gamma_1}{2v_o(\Gamma_1^2 - \Gamma^2)(j\beta e - \Gamma)^2} \quad (37)$$

which reduced to $$\epsilon^3 = -j\beta e^3 \frac{KI_o}{4v_o} \quad (38)$$

Let $C^3 = (KI_o/4V_o)$ and $\delta = (-j)^{\frac{1}{3}}$
where C = gain parameter
Then $$\xi = \beta e C \delta \quad (39)$$

Equation (39) is the root equation for the propagation constants. The 4th root was eliminated by the approximations made above. The three waves are forward waves and the 4th wave is a backward wave with a propagation constant.

$$-\Gamma = j\beta e(1 - (C^2/4)) \quad (40)$$

In the following section, numerical estimates are given for the effective voltage, $V_o$, average d-c velocity, $U_o$, and the gain parameter, C. The numeral estimate for C, indicates that C is indeed small and the approximations made above are reasonable.

In an attempt to obtain a better understanding of the theory of operation for the present invention, numerical estimates are given for the voltage, velocity, gain parameter and other terms needed to calculate the above three parameters.

A maximum and minimum condition can be found for $Q(\partial H_{ox})/\partial Z$, the bias field gradient. Equation (32) has an upper limit since the average d-c velocity must be less than the velocity of light, c.
Therefore:

$$Q < (96ac/\gamma h^2) \quad (41)$$

Also to overcome wall coercivity $H_c$, the below condition must be met:

$$\Delta H_{ox} > (8H_c/\pi) \text{ or } QH > (8H_c/\pi) \quad (42)$$

The upper and lower limits for Q are $$(8H_c/\pi h) < Q < (96ac/\gamma h^2) \quad (43)$$

Equation (43) indicates that $H_c$ and h have maximum values consistent with a given damping constant, a, and necessary to propagate and maintain stable domains.

As an example of the application of equation (43), if one chooses $H_c = 0.1$ oersteds, $a = 10^{-2}$, and $h = 1 \times 10^{-6}$ m then equation (43) becomes $$20.4 \times 10^6 < Q < 16.4 \times 10^8 (amp/m^2), \text{ in mks units} \quad (44)$$

Also, an estimate can be found for the mean velocity, $U_o$, by using equation (32) and a value for Q chosen from equation (44) to be $10^7$ amp/$m^2$.
Then $$U_o \approx 1.8 \times 10^6 \text{m/sec.} \quad (45)$$

The ratio $U_o/c$ for a range of voltages, $V_o$, is given in Table I. Equation (36) is used to calculate the $U_o/c$ ratio. Assumed values for h, $\omega_o$, and $\sqrt{\mu/\epsilon}$ are $h = 10^{-6}$ m, $\omega_o = 25$ MHz, and $\sqrt{\mu/\epsilon} = 100\Omega$.

Table I

The Ratio $\frac{U_o}{c}$ For Several Voltages,

| $v_o$ (volts) | $\frac{U_o}{c}$ |
|---|---|
| 1 | 0.001 |
| 10 | 0.003 |
| 100 | 0.010 |
| 1000 | 0.031 |

$$\sqrt{\frac{h\omega_o}{(\mu/\epsilon)^{\frac{1}{2}}}} = \frac{1}{2}\Omega - \frac{1}{2}$$

In obtaining a reasonable estimate for the gain parameter C, the interaction impedance, K, must be known. Theoretical calculations of, K, for a meander line circuit in conjunction with an electron beam have been solved. The calculations involve the solutions to Maxwell's equations subject to the appropriate boundary conditions. The configuration and current density of an electron beam in vicinity to the meander line RF circuit must be considered. The electrons closest to the RF circuit play a more important role in the interaction process since the magnitudes of the RF fields decrease rapidly away from the RF circuit. As an example for the helix circuit one tries to obtain a filling factor (radius of electron beam to the radius of the helix) as close to a value 1 which is consistent with heat dissipation and focusing considerations. For the present invention, the low of magnetic charges are restricted to the surface of the orthoferrite 14 and as such are very close to the meander line RF circuit 10 except for a thin sheet of dielectric material 12. The relative dielectric constants of both the dielectric sheet and orthoferrite will have the effect of reducing the magnitudes of the RF fields and consequently, K. Therefore, low dielectric constants are desirable for this aspect.

One important feature of this invention is found by looking at the condition (equation (20)) imposed by equation (20) on the RF magnetic field $h_x$ in order to obtain the wave solutions. This condition indicates that the device can generate waves of very high frequencies (millimeter range).

Thus what has been shown and described is a new device for amplifying RF signals which involves the marriage of two technologies, traveling wave tubes and magnetic bubble domains.

Accordingly,
I claim as my invention:
1. A circuit arrangement for amplifying an electromagnetic wave comprising the combination:
   a slow wave structure coupled to an electromagnetic wave source for propagating an electromagnetic wave thereon from one end to the other;
   a medium located adjacent said slow wave structure which is adapted to sustain and translate magnetic domains therein, said domains providing magnetic surface charges on said medium which is adapted to interact with said electromagnetic wave; and
   means located adjacent said medium for translating said magnetic domains from input to output positions at substantially the same velocity as said electromagnetic waves propagates from said one end to the other whereby energy is transferred from said magnetic surface charges to said electromagnetic wave providing amplification of said wave.
2. The circuit as defined by claim 1 whereby said slow wave structure comprises a meander line circuit coupled at said one end to an RF input source and at said other end to an RF utilization circuit.

3. The circuit arrangement as defined by claim 2 wherein said medium comprises orthoferrite material.

4. The circuit arrangement as defined by claim 2 wherein said medium comprises a platelet of orthoferrite material coextensive with said meander line circuit.

5. The circuit arrangement as defined by claim 4 wherein said platelet has a substantially uniform thickness and of a dimension which is adapted to translate cylindrical magnetic domains having a wall height equal to the thickness of said platelet and a cross sectional dimension substantially equal to the wall height.

6. The circuit arrangement as defined by claim 1 wherein said slow wave structure is adapted to propagate electromagnetic waves in a TEM mode.

7. The circuit arrangement as defined by claim 1 wherein said medium comprises a slice of material in which single wall magnetic domains can be moved and having a thickness selectively chosen such that the magnetostatic energy and wall energy are substantially in balance.

8. The circuit arrangement as defined by claim 1 wherein said slow wave structure comprises a serpentine pattern of metallization formed on a thin sheet of dielectric material,
wherein said medium comprises a relatively thin sheet of orthoferrite material adjacent said thin sheet of dielectric material on which said metallization pattern is formed, and
additionally including means generating a biasing magnetic field applied through said medium perpendicular to the direction of translation of said magnetic domains.

9. The circuit arrangement as defined by claim 1 wherein said means for translating said magnetic domains comprises a permalloy circuit pattern formed adjacent said medium and including means for providing a rotating field in the plane of said permalloy pattern.

10. The circuit arrangement as defined by claim 1 wherein said slow wave structure comprises a meander line circuit, wherein said medium comprises a slice of material in which magnetic domains can be formed and moved, and
wherein said means for moving said magnetic domains comprises an electrical conductor and magnetic field means adjacent the surface of said slice of material, said conductor having a repetitive geometry acting in concert with said magnetic field means for generating a pattern of attracting and repelling magnetic fields in a predetermined manner for moving said magnetic domains from input to output positions.

11. The circuit arrangement as defined by claim 1 wherein said medium comprises a sheet of magnetic material in which wall magnetic domains can be moved, said material having a preferred direction for magnetization substantially normal to the plane of said sheet,
additionally including means for providing a field substantially normal to the plane of said sheet and of a polarity to contract magnetic domains to a preferred diameter,
wherein said means for propagating said domains comprises a magnetic layer capable of providing changing pole patterns in response to a rotating transverse field adjacent said sheet for defining a propagation channel for said magnetic domains in said sheet, and
means for generating a rotating magnetic field in the plane of said sheet.

* * * * *